(12) United States Patent
Tsuchiya

(10) Patent No.: US 8,587,060 B2
(45) Date of Patent: Nov. 19, 2013

(54) SEMICONDUCTOR DEVICE AND METHOD FOR MANUFACTURING THE SAME

(75) Inventor: Yoshinori Tsuchiya, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/404,349

(22) Filed: Feb. 24, 2012

(65) Prior Publication Data

US 2013/0062622 A1     Mar. 14, 2013

(30) Foreign Application Priority Data

Sep. 8, 2011   (JP) ................. 2011-195978

(51) Int. Cl.
*H01L 29/76*     (2006.01)
*H01L 31/062*    (2012.01)

(52) U.S. Cl.
USPC ............. 257/341; 257/77; 257/331; 257/335; 257/342; 438/268; 438/270

(58) Field of Classification Search
USPC ............. 257/77, 341–342, 331, 335, E27.06; 438/268, 270
See application file for complete search history.

(56) References Cited

U.S. PATENT DOCUMENTS 6,452,228 B1 *  9/2002  Okuno et al. ................. 257/329
2007/0037373 A1 *  2/2007  Hsiao et al. ................. 438/592

FOREIGN PATENT DOCUMENTS

JP        2009-49198        3/2009

* cited by examiner

*Primary Examiner* — Theresa T Doan
(74) *Attorney, Agent, or Firm* — Oblon, Spivak, McClelland, Maier & Neustadt, L.L.P.

(57) ABSTRACT

A semiconductor device according to the present embodiment includes a semiconductor substrate having a first n-type silicon carbide layer and a second n-type silicon carbide layer, a first p-type impurity region formed in the n-type silicon carbide layer, a first n-type impurity region of 4H—SiC structure formed in the n-type silicon carbide layer, a second n-type impurity region of 3C—SiC structure formed in the n-type silicon carbide layer having a depth shallower than the first n-type impurity region, a gate insulating film, a gate electrode formed on the gate insulating film, and a metallic silicide layer formed above the first n-type impurity region and having a bottom portion and a side surface portion such that the second n-type impurity region is sandwiched between the first n-type impurity region and at least the side surface portion.

3 Claims, 12 Drawing Sheets

SEMICONDUCTOR DEVICE AND METHOD FOR MANUFACTURING THE SAME

CROSS-REFERENCE TO RELATED APPLICATION

This application is based upon and claims the benefit of priority from Japanese Patent Application No. 2011-195978, filed on Sep. 8, 2011, the entire contents of which are incorporated herein by reference.

FIELD

Embodiments described herein relate generally to a semiconductor device and a method for manufacturing the semiconductor device.

BACKGROUND

As a next generation power semiconductor device material, silicon carbide (which may be hereinafter also denoted as SiC) attracts attention. SiC has about 10 times the breakdown field strength and about three times thermal conductivity of silicon (which may be hereinafter also denoted as Si), and SiC can achieve a power semiconductor device capable of operating at a high temperature with a low loss, which cannot be achieved with a Si power device.

For example, a high voltage power MOSFET has a low ON-resistance and high breakdown voltage, and can achieve fast switching operation. Accordingly, it is widely used as a switching device for a power circuit such as a switching power supply. The device structure of the high voltage power MOSFET has a vertical-type MOSFET structure in which a source electrode, a gate electrode, and a well electrode are formed on a substrate surface, and a drain electrode is formed on a back surface of the substrate. Double Implantation MOSFET (which may be hereinafter also denoted as DIMOSFET) structure in which a channel formation region (well region) and a source region are respectively formed on a substrate surface using ion implantation is an advantageous device structure in which the channel region can be easily formed with high precision, and this is also suitable for parallel operation.

When a DIMOSFET using a SiC substrate is formed, an electrode for connecting this device to an electrical circuit and the like is desired to be in ohmic contact. However, a generally used hexagonal single-crystal SiC substrate has 4H—SiC structure of which laminating cycle is 4, and an energy band gap thereof is 3.26 eV, i.e., three times the energy band gap of Si. Therefore, it is difficult to form ohmic contact with a metallic electrode.

To solve this problem, a method for reducing the contact resistance has been suggested, in which the crystal structure of a source region is changed into a cubical crystal SiC structure having a lower energy band gap than that of the 4H—SiC structure (which may also be hereinafter referred to as 3C—SiC structure). More specifically, when the source region is formed, the 4H—SiC substrate of the source region is made into amorphous state by ion implantation, and the SiC having 3C—SiC structure is recrystallized with subsequent high-temperature thermal treatment. In this case, an energy band offset between 4H—SiC and 3C—SiC mainly occurs in a conduction band, and Schottky barrier is reduced about 0.9 eV, so that the contact resistance between the n-type SiC and the metallic electrode is reduced.

DETAILED DESCRIPTION

Figure 1:
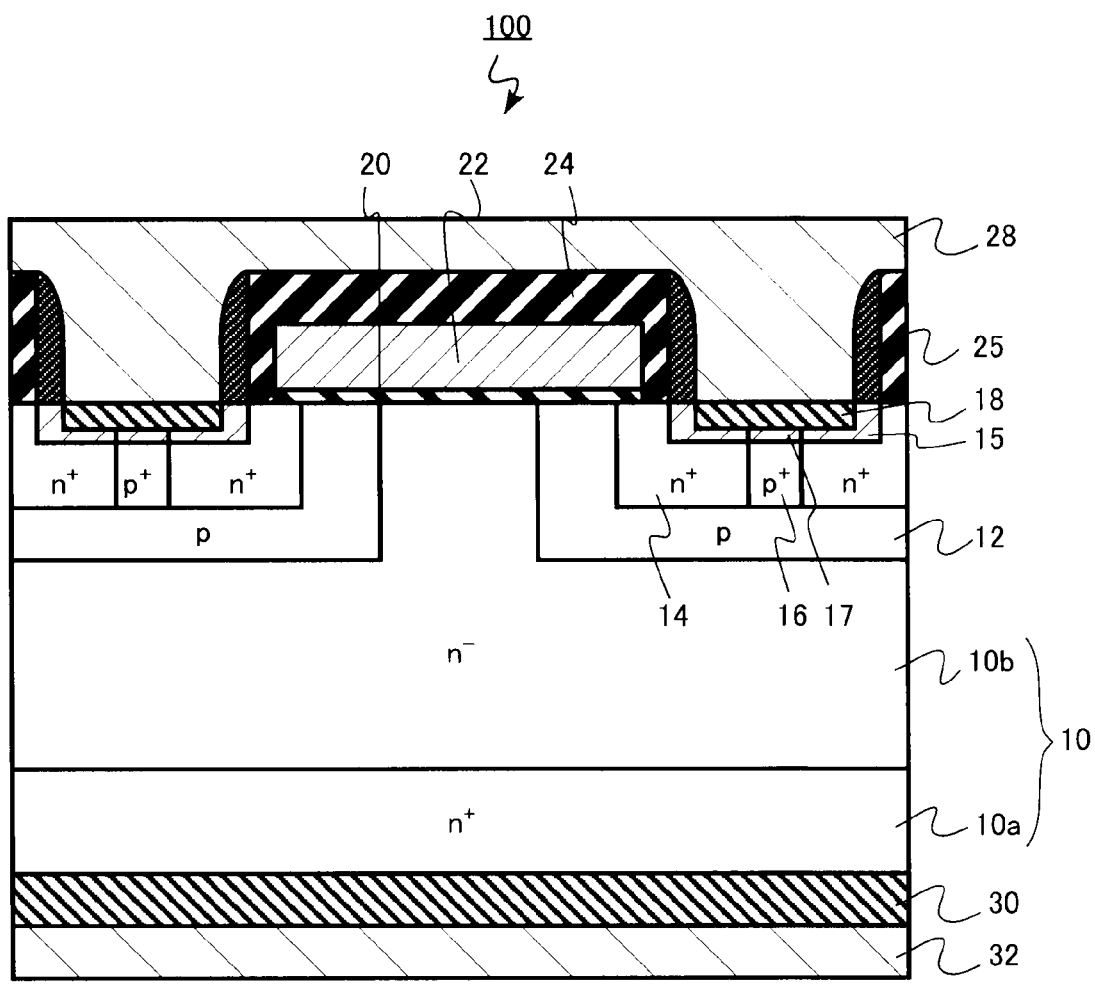
FIG. 1 is a cross sectional schematic diagram illustrating a semiconductor device according to a first embodiment.

A semiconductor device according to an embodiment includes a semiconductor substrate having a first n-type silicon carbide layer and a second n-type silicon carbide layer of which n-type impurity concentration is less than that of the first n-type silicon carbide layer, a first p-type impurity region formed in the second n-type silicon carbide layer, a first n-type impurity region of 4H—SiC structure formed in the second n-type silicon carbide layer, a second n-type impurity region of 3C—SiC structure formed in the second n-type silicon carbide layer and having a depth shallower than that of the first n-type impurity region, a gate insulating film extending over surfaces of the second n-type silicon carbide layer, the first p-type impurity region, and the first n-type impurity region, a gate electrode formed on the gate insulating film, and a metallic silicide layer formed above the first n-type impurity region and having a bottom portion and a side surface portion such that the second n-type impurity region is sandwiched between the first n-type impurity region and at least the side surface portion.

As described above, the contact resistance can be reduced by changing the crystal structure of the source region into a 3C—SiC structure having a lower energy band gap than that of the 4H—SiC structure.

However, when this method is used, 3C—SiC formed in the source region generally does not become single crystal, and has a polycrystalline structure including many crystal grains, which increases the resistance rate (specific resistance) of the source region. This resistance component becomes a parasitic resistance connected to the channel resistance in series during device operation, which increases the characteristic ON-resistance, and becomes a factor of significantly deteriorating the device performance.

Hereinafter, embodiments of the present invention will be described with reference to the drawings.

(First Embodiment)

A semiconductor device according to the present embodiment includes a semiconductor substrate having a first n-type silicon carbide layer and a second n-type silicon carbide layer of which n-type impurity concentration is less than that of the first n-type silicon carbide layer, a first p-type impurity region formed in the second n-type silicon carbide layer, a first n-type impurity region of 4H—SiC structure formed in the second n-type silicon carbide layer, a second n-type impurity region of 3C—SiC structure formed in the second n-type silicon carbide layer and having a depth shallower than that of the first n-type impurity region, a gate insulating film extending over surfaces of the second n-type silicon carbide layer, the first p-type impurity region, and the first n-type impurity region, a gate electrode formed on the gate insulating film, and a metallic silicide layer formed above the first n-type impurity region and having a bottom portion and a side surface portion such that the second n-type impurity region is sandwiched between the first n-type impurity region and the bottom portion and the side surface portion.

Further, a second p-type impurity region connected to the first p-type impurity region and having a depth shallower than that of the first p-type impurity region and having a p-type impurity concentration higher than that of the first p-type impurity region is further provided, and the metallic silicide layer is also formed on the second p-type impurity region.

The semiconductor device according to the present embodiment is a DIMOSFET. In the DIMOSFET according to the present embodiment, the metallic silicide in the source region is connected to the n-type impurity region of 3C—SiC structure. Accordingly, a Schottky barrier between the metallic silicide and the n-type impurity region is reduced, and the contact resistance is reduced. On the other hand, in the source region, around the n-type impurity region of the 3C—SiC structure, an n-type impurity region of 4H—SiC structure having a low specific resistance due to single crystal is formed. Accordingly, this can suppress the increase of the parasitic resistance in the n-type impurity region due to the introduction of the 3C—SiC structure.

FIG. 1 is a cross sectional schematic diagram illustrating a semiconductor device according to the present embodiment.

As shown in FIG. 1, a DIMOSFET 100 uses a SiC substrate 10 of hexagonal 4H—SiC including an n$^+$-type SiC layer (first n-type silicon carbide layer) 10$a$ and an n$^-$-type SiC layer (second n-type silicon carbide layer) 10$b$ having an n-type impurity concentration lower than that of the n$^+$-type SiC layer 10$a$.

For example, the n$^+$-type SiC layer 10$a$ includes n-type impurity such as N (nitrogen) with an impurity concentration of about $1 \times 10^{18}$ to $1 \times 10^{19}$ cm$^{-3}$. The n$^+$-type SiC layer 10$a$ functions as a drain region of the DIMOSFET 100.

For example, the n$^-$-type SiC layer 10$b$ is formed using an epitaxial growth method on the n$^+$-type SiC layer 10$a$. For example, the impurity concentration of the n-type impurity is about $1 \times 10^{15}$ to $1 \times 10^{17}$ cm$^{-3}$. The thickness of the n$^-$-type SiC layer 10$b$ is, for example, about 5 to 10 µm.

The n$^-$-type SiC layer 10$b$ is formed with a p-type SiC region (first p-type impurity region) 12 of 4H—SiC structure. The p-type SiC region 12 functions as a channel region or a well region of the DIMOSFET 100. The impurity concentration of the p-type SiC region 12 is, for example, about $5 \times 10^{16}$ to $2 \times 10^{18}$ cm$^{-3}$. The junction depth is about 0.1 µm to 1.5 µm.

In the n$^-$-type silicon carbide layer 10$b$, an n$^+$-type SiC region (first n-type impurity region) 14 of 4H—SiC structure is formed to be enclosed by the p-type SiC region 12. The n$^+$-type SiC region 14 functions as a source region of the DIMOSFET 100. The n$^+$-type SiC region 14 is single crystal.

The junction depth thereof is within a range of 0.05 µm to 1 µm, which is shallower than the junction depth of the p-type SiC region 12. The impurity of the n$^+$-type SiC region 14 is, for example, nitrogen (N) or phosphorous (P) or both of them, and for example, the impurity concentration is preferably about $5 \times 10^{19}$ to $3 \times 10^{21}$ cm$^{-3}$.

In the n$^-$-type SiC layer 10$b$, a p$^+$-type SiC region (second p-type impurity region) 16 of 4H—SiC structure is formed. The p$^+$-type SiC region (second p-type impurity region) 16 is enclosed by the p-type SiC region 12, is connected to the p-type SiC region 12, and is in contact with the n$^+$-type SiC region 14. The p$^+$-type SiC region 16 functions as a well connection region of the DIMOSFET 100.

The depth of the p$^+$-type SiC region 16 is in a range of 0.05 µm to 1 µm, which is shallower than the p-type SiC region 12. The impurity in the p$^+$-type SiC region 16 is boron (B) or aluminum (Al), or both of them. The impurity concentration is desirably about $1 \times 10^{19}$ to $3 \times 10^{21}$ cm$^{-3}$.

In addition, in the n$^-$-type SiC layer 10$b$, an n$^+$-type SiC region (second n-type impurity region) 15 of 3C—SiC structure and a p$^+$-type SiC region (third p-type impurity region) 17 of 3C—SiC structure are formed to be enclosed by the n$^+$-type SiC region (first n-type impurity region) 14 of the 4H—SiC structure and the p$^+$-type SiC region (second p-type impurity region) 16 of the 4H—SiC structure. Both of the n$^+$-type SiC region 15 of the 3C—SiC structure and the p$^+$-type SiC region 17 of the 3C—SiC structure are shallower than the n$^+$-type SiC region 14 and the p$^+$-type SiC region 16 of the 4H—SiC structure.

The n$^+$-type SiC region (second n-type impurity region) 15 of the 3C—SiC structure functions as a source region of the DIMOSFET 100. The p$^+$-type SiC region (third p-type impurity region) 17 of the 3C—SiC structure functions as a well connection region of the DIMOSFET 100.

The impurity of the n$^+$-type SiC region 15 of the 3C—SiC structure is, for example, nitrogen (N) or phosphorous (P) or both of them, and for example, the impurity concentration is preferably about $5 \times 10^{19}$ to $3 \times 10^{21}$ cm$^{-3}$.

The impurity in the p$^+$-type SiC region 17 of the 3C—SiC structure is boron (B) or aluminum (Al), or both of them. The impurity concentration is desirably about $1 \times 10^{19}$ to $3 \times 10^{21}$ cm$^{-3}$.

The n$^+$-type SiC region 15 of the 3C—SiC structure and the p$^+$-type SiC region 17 of the 3C—SiC structure have polycrystalline structures, or have single-crystal structures of which crystallinity is degraded as compared with the n$^+$-type SiC region 14 and the p$^+$-type SiC region 16 of the 4H—SiC structure. In this case, the single-crystal structure of which crystallinity is degraded means existence of much discontinuities of atomic bonds such as crystal defect density dislocation density. The crystallinity in microscopic regions may be evaluated by observation with a high resolution transmission electron microscope.

The impurity concentrations in these regions are the same as the n$^+$-type SiC region 14 and the p$^+$-type SiC region 16 of the 4H—SiC structure during the process of manufacture of the device, but they may be segregated to crystalline interfaces at a concentration higher than that in the crystal grain, or in order to reduce the contact resistance, they may be intentionally set at a higher concentration than those of the n$^+$-type SiC region 14 and the p+-type SiC region 16 of the 4H—SiC structure. Even in such case, the impurity concentration is preferably equal to or less than $5\times10^{21}/cm^3$.

A first nickel silicide layer (nickel silicide film) 18 is formed to be covered with the n+-type SiC region 15 of the 3C—SiC structure and the p+-type SiC region 17 of the 3C—SiC structure. In other words, the first nickel silicide layer (nickel silicide film) 18 is formed on the n+-type SiC region 14 of the 4H—SiC structure. Further, the first nickel silicide layer (nickel silicide film) 18 includes a bottom portion and a side surface portion, and with the side surface portion and the bottom portion, the n+-type SiC region 15 of the 3C—SiC structure is sandwiched between the n+-type SiC region 14 of the 4H—SiC structure and the first nickel silicide layer (nickel silicide film) 18.

It should be noted that the first nickel silicide layer (nickel silicide film) 18 may include carbon (C).

The first nickel silicide layer 18 functions as a source electrode and a well electrode of the DIMOSFET 100.

The film thickness of the first nickel silicide layer 18 is in a range of, for example, 10 nm to 200 nm, which is thinner than the n+-type SiC region 15 of the 3C—SiC structure and the p+-type SiC region 17 of the 3C—SiC structure.

A gate insulating film 20 is continuously formed over the surfaces of the second n-type SiC layer 10b, the p-type SiC layer 12, and the n+-type SiC region 14. The gate insulating film 20 does not have to cover the entire surface of the surface of the n+-type SiC region 14.

The gate insulating film 20 may be, for example, a silicon oxide film. The film thickness of the silicon oxide film is desirably 10 nm to 160 nm.

On the gate insulating film 20, a gate electrode 22 is formed. The gate electrode 22 may be, for example, polycrystal silicon and the like.

The impurity concentration of the polycrystal silicon is desirably about $1\times10^{19}$ cm$^{-3}$. Regarding the impurity, n-type or p-type impurity element may be selected according to the threshold voltage required for the device.

On the gate electrode 22, for example, a layer insulating film 24 made of a silicon oxide film is formed.

On the layer insulating film 24, a first metallic electrode 28 is formed. In a contact hole portion (opening portion) provided in the layer insulating film 24, a first metallic electrode 28 is formed on the first nickel silicide region 18, so that the first nickel silicide region 18 is connected to the first metallic electrode 28. The first metallic electrode is, for example, aluminum (Al). The first metallic electrode 28 functions as a source electrode and a well electrode of the DIMOSFET 100.

The contact hole portion (opening portion) is formed with a first insulating film side wall 25. The first insulating film is, for example, a silicon nitride film.

The n+-type SiC region 15 of the 3C—SiC structure is formed using ion implantation using the layer insulating film 24 as a mask, which will be explained later in detail in the description about the manufacturing method of the present embodiment. Accordingly, the boundary in the horizontal direction between the n+-type SiC region 15 of the 3C—SiC structure and the n+-type SiC region 14 of the 4H—SiC structure is basically in consistent with the boundary position in the horizontal direction between the layer insulating film 24 and the side wall 25, and the error range thereof is within a range of 0.2 µm.

When a voltage equal to or more than the threshold voltage is applied to the gate electrode 22, a channel is formed in a surface region of the p-type SiC region 12, and an ON-current flows in the DIMOSFET 100.

On the n+-type SiC layer 10a, i.e., the back surface side of the SiC substrate 10, for example, a second nickel silicide layer 30 is formed.

Further, on the second nickel silicide layer 30, a second metallic electrode 32 is formed. The second metallic electrode 32 functions as a drain electrode. The second metallic electrode is, for example, an aluminum (Al) film.

Hereinabove, a silicon oxide film has been explained as an example of the gate insulating film 20, but examples of gate insulating film materials other than the silicon oxide film include high dielectrics such as $Si_3N_4$, $Al_2O_3$, $Ta_2O_5$, $TiO_2$, $La_2O_5$, $CeO_2$, $ZrO_2$, $HfO_2$, $SrTiO_3$, and $Pr_2O_3$. In addition, a material including a combination high dielectrics such as LaAl oxides may be used. Alternatively, silicate, i.e., a material obtained by mixing metal ions to a silicon oxide, may be used.

In addition, a silicon oxide film and a high dielectric film may be stacked, and a threshold value may be adjusted with an interface dipole and fixed charges formed in the film and the interface. Introduction of nitrogen, hydrogen, and the like to the gate insulating film and the interface thereof is effective for reducing the fixed charges and the interface trap concentration in the gate insulating film and the interface thereof, which may cause degradation of the device characteristics. For example, introduction of nitrogen may be performed at a necessary position with an appropriate concentration in accordance with the performance and the film thickness of the gate insulating film required for the device, for example, methods with $NH_3$ and $NO_2$ gases and nitrogen made into plasma.

For the gate insulating film, materials having heat-resistance required by transistors of respective generations and manufacturing processes thereof may be selected as necessary and used.

In the above example, nickel (Ni) is explained as an example of metal for forming the metal silicide of the source electrode and the well electrode. However, the metal for forming the metal silicide is not limited to the nickel. A metal for forming silicide with solid phase reaction with SiC upon thermal treatment may be used as necessary according to the form of a device.

For example, a stacked structure or an alloy of metal preferentially reacting with carbon (C) in reaction with SiC such as Ni/Ti and Ni—Ti alloys may be used.

The reaction between SiC and metal is performed at a temperature higher than the reaction temperature between silicon (Si) and metal, and this may deteriorate the device characteristics manufactured according to this thermal treatment. In this case, the reaction temperature may be reduced by including, for example, Si and Ge in the metal for forming the silicide. The composition ratio between Si, Ge and the metal for forming the silicide may be adjusted by controlling the temperature, the time, and the like of thermal treatment according to a work function of the electrodes required in the device. Examples of metals for forming the metal silicide include not only Ni but also Pd, Pt, Co, Ta, Hf, and Zr.

The present embodiment has such structure that the first nickel silicide layer 18 serving as the source electrode is in contact with the n+-type SiC region 15 of the 3C—SiC structure having a smaller band gap and a lower Schottky barrier against electrons as compared with the n+-type SiC region 14 of the 4H—SiC structure. Therefore, this achieves a lower contact resistance as compared with a case where the first nickel silicide layer 18 is directly in contact with the n+-type SiC region 14 of the 4H—SiC structure.

In addition, the n+-type SiC region 15 of the 3C—SiC structure is independent from the n+-type SiC region 14 of the 4H—SiC structure, and during the manufacturing process, the thicknesses in the horizontal direction and the vertical direction can be controlled to be any values.

For this reason, in view of the size of the first nickel silicide layer 18 formed later, the thicknesses in the horizontal direction and the vertical direction can be controlled. As a result, like the contact resistance, the diffusion layer resistance connected in series to the channel resistance can be minimized, and the ON-resistance of the DIMOSFET 100 can be reduced.

The thicknesses in the horizontal direction and the vertical direction of the $n^+$-type SiC region 15 of the 3C—SiC structure are preferably within a range of 1 nm to 50 nm. In this range, the increase of the specific resistance of the $n^+$-type SiC region 15 of the 3C—SiC structure with respect to the channel resistance can be disregarded.

The nickel silicide/SiC interface usually has a roughness in the order of nm or more. Therefore, in order to stably make the structure of the nickel silicide/SiC interface into 3C—SiC without variation, the thickness of the $n^+$-type SiC region 15 of the 3C—SiC structure is preferably within a range of 5 nm to 40 nm.

However, even when the roughness of the nickel silicide/SiC interface is high, and there exists a region where the $n^+$-type SiC region 15 of the 3C—SiC structure is broken partially, the effect of reduction of the contact resistance due to the 3C—SiC crystal structure is obtained as long as the size of area of the interface is not more than 50% of the total size of contact area.

According to the present embodiment, the junction portion between the n-type diffusion layer of the source region and the p-type diffusion layer of the well region is constituted by 4H—SiC continuous in terms of crystal structure. Therefore, it is less likely to cause a problem due to crystal defect, as compared with a case where the 3C—SiC n-type diffusion layer comes to the junction portion between the source region and the well region, i.e., the junction portion has a misfit region of 4H—SiC and 3C—SiC.

Subsequently, a manufacturing method of the DIMOSFET 100 according to the present embodiment as shown in FIG. 1 will be explained. FIGS. 2 to 8 are cross sectional schematic diagrams illustrating steps of the method for manufacturing the semiconductor device according to the present embodiment.

The manufacturing method of the DIMOSFET 100 of the semiconductor device according to the present embodiment includes the steps of preparing a semiconductor substrate having a first n-type silicon carbide layer and a second n-type silicon carbide layer of which n-type impurity concentration is less than that of the first n-type silicon carbide layer, forming a first p-type impurity region in the second n-type silicon carbide layer, forming a first n-type impurity region of 4H—SiC structure in the second n-type silicon carbide layer, forming a gate insulating film extending over surfaces of the second n-type silicon carbide layer, the first p-type impurity region, and the first n-type impurity region, forming a gate electrode on the gate insulating film, using ion implantation to make at least a portion of the first n-type impurity region into amorphous state, recrystallizing the region made into the amorphous state by a first thermal treatment and forming a second n-type impurity region of 3C—SiC structure of which depth is shallower than the first n-type impurity region, forming a metallic film on a portion of the second n-type impurity region, and using a second thermal treatment to react the metallic film and a silicon carbide of the second n-type impurity region and forming a metallic silicide layer having a bottom portion and a side surface portion such that the second n-type impurity region is sandwiched between the first n-type impurity region and the bottom portion and the side surface portion.

A step of forming a second p-type impurity region connected to the first p-type impurity region and having a depth shallower than that of the first p-type impurity region and having a p-type impurity concentration higher than that of the first p-type impurity region is further provided, and the metallic silicide layer is also formed on the second p-type impurity region.

Further, after the step of forming the gate electrode, the following steps are provided: forming a first insulating film on the first n-type impurity region and forming an opening portion in the first insulating film so as to expose a portion of the first n-type impurity region. Further, in the step of making a portion of the first n-type impurity region into amorphous state, the ion implantation is performed using the first insulating film as a mask.

Further, between the step of forming the second n-type impurity region and the step of forming the metallic film, a step of forming a second insulating film side wall in the opening portion is provided.

First, the SiC substrate (semiconductor substrate) is prepared. The SiC substrate (semiconductor substrate) includes the $n^+$-type SiC layer (first n-type silicon carbide layer) 10a of 4H—SiC and the $n^-$-type SiC layer (second n-type silicon carbide layer) 10b of the 4H—SiC structure of which n-type impurity concentration is less than that of the $n^+$-type SiC layer 10a.

The thickness of the $n^-$-type SiC layer (second n-type silicon carbide layer) 10b is, for example, 10 μm, and is formed using an epitaxial growth method on the $n^+$-type SiC layer (first n-type silicon carbide layer) 10a.

Subsequently, in the $n^-$-type SiC layer 10b, the p-type impurity region (first p-type impurity region) 12 of the 4H—SiC structure is formed by, for example, thermal treatment (annealing) with Al ion implantation and activation. In addition, in the $n^-$-type SiC layer 10b, the $n^+$-type SiC region (n-type impurity region) 14 of the 4H—SiC structure is formed by, for example, thermal treatment (annealing) with P ion implantation and activation.

Figure 2:
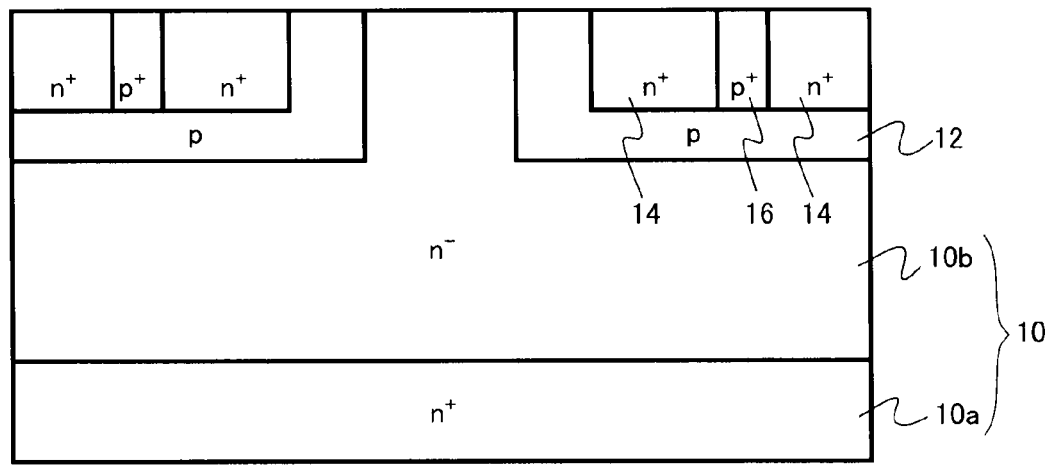
FIG. 2 is a cross sectional schematic diagram illustrating a step of a method for manufacturing the semiconductor device according to the first embodiment.

Subsequently, in the n -type SiC layer 10b, the $p^+$-type SiC region (second p-type impurity region) 16 of the 4H—SiC structure is formed. The $p^+$-type SiC region (second p-type impurity region) 16 is connected to the p-type SiC region 12, has a depth shallower than the p-type SiC region 12, and has a higher p-type impurity concentration than the p-type SiC region 12. The $p^+$-type SiC region 16 is formed by, for example, thermal treatment (annealing) with Al ion implantation and activation (FIG. 2).

In the ion implantation for forming the p-type impurity region (first p-type impurity region) 12 of 4H—SiC structure, the $n^+$-type SiC region (first n-type impurity region) 14 of the 4H—SiC structure, and the $p^+$-type SiC region (second p-type impurity region) 16, it is effective to increase the substrate temperature during the ion implantation in order to suppress the degradation of SiC crystallinity caused by physical damage during the ion implantation, and in this case, the range of the substrate temperature is desirably 400 to 650° C.

Subsequently, using a known method, the gate insulating film 20 made of, for example, a silicon oxide film, is formed to extend over the surfaces of the $n^-$-type SiC layer 10b, the p-type SiC region 12, and the $n^+$-type SiC region 14. Then, on the gate insulating film 20, for example, the gate electrode 22 of the polycrystal n-type silicon is formed by photolithography and anisotropic etching and isotropic etching.

Then, the layer insulating film (first insulating film) 24 is formed on the gate electrode 22 and the n$^+$-type SiC region (first n-type impurity region) 14 of the 4H—SiC structure. The layer insulating film 24 is, for example, a silicon oxide film, and is formed by, for example, chemical vapor deposition (CVD) method.

Figure 3:
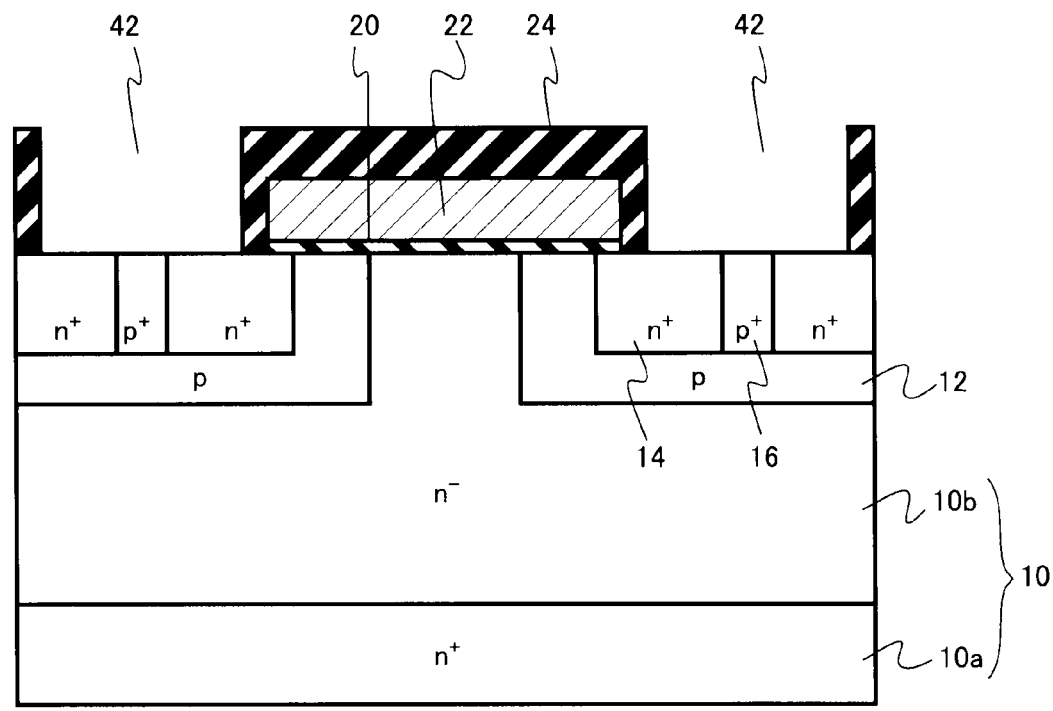
FIG. 3 is a cross sectional schematic diagram illustrating a step of the method for manufacturing the semiconductor device according to the first embodiment.

Subsequently, on the layer insulating film 24, the contact holes (opening portion) 42 are formed by photolithography and anisotropic etching so that the n$^+$-type SiC region 14 and the p$^+$-type SiC region 16 are exposed (FIG. 3). The size of the region of the 3C—SiC structure formed in the 4H—SiC substrate in the horizontal direction, i.e., direction in parallel to the principal surface of the substrate, is defined with this contact hole 42.

Subsequently, using the layer insulating film (first insulating film) 24 as a mask, for example, germanium (Ge) ion implantation is performed on a portion of the n$^+$-type SiC region (first n-type impurity region) 14 of the 4H—SiC structure and the p$^+$-type SiC region (second p-type impurity region) 16 of the 4H—SiC structure.

Figure 4:
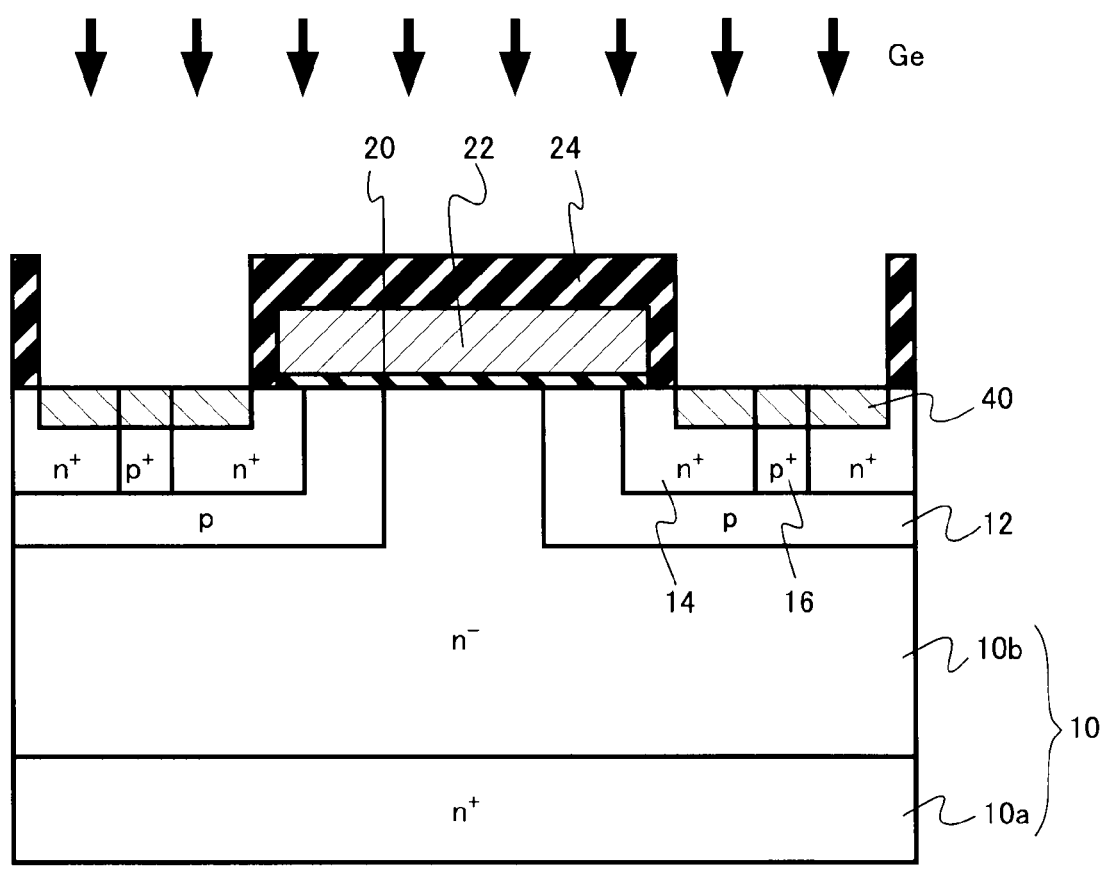
FIG. 4 is a cross sectional schematic diagram illustrating a step of the method for manufacturing the semiconductor device according to the first embodiment.

With this ion implantation, physical damage is applied to SiC in proximity to the surface of the p$^+$-type SiC region 16 and the portion of the n$^+$-type SiC region 14 exposed on the bottom portion of the contact hole, so as to make the SiC in proximity to the surface into amorphous state to form an amorphous layer 40 (FIG. 4).

Ion species are preferably selected from elements that can efficiently make the SiC into amorphous state and are less likely to affect the device characteristics. Elements such as germanium (Ge), silicon (Si), chemically stable noble gas elements such as argon (Ar) and xenon (Xe) may be used.

When the substrate is cooled with, for example, liquid nitrogen, during the ion implantation, this suppresses the effect of crystal recovery caused by increase of the substrate temperature during the ion implantation, which can cause amorphous state efficiently. In addition, by cooling the substrate, the crystal defect density at the crystal interface between the amorphous layer 40 and the SiC can be reduced. In addition, by cooling the substrate, it is easy to keep on conversion into amorphous state even when light element ions such as carbon (C) is used.

The energy of the ion implantation defines a region depth of a 3C—SiC structure formed later. It may be determined to achieve a desired depth in view of the mass of the element to be implanted. For example, it may be determined so that the amorphous layer 40 becomes 0.01 μm to 0.4 μm.

Subsequently, the amorphous layer 40 is recrystallized by the first thermal treatment, thereby forming the n$^+$-type SiC region 15 of the 3C—SiC structure and the p$^+$-type SiC region 17 of the 3C—SiC structure of which depth is shallower than the n$^+$-type SiC region (first n-type impurity region) 14 of the 4H—SiC structure.

The thermal treatment of recrystallizing process may use rapid thermal annealing (RTA), and the temperature range is desirably within a range of 900° C. to 1500° C. Annealing process for a long time at a high temperature of 1500° C. or more deteriorates the characteristics of the gate insulating film and the interface thereof, and causes reduction of mobility of the channel, thus deteriorating the device characteristics. At a temperature less than 900° C., recrystallizing process of the amorphous layer 40 may not be done sufficiently. Therefore, the temperature control of thermal treatment for forming the 3C—SiC structure region is important.

In order to suppress the degradation of the characteristics of the gate insulating film and the interface thereof, it is effective to perform annealing in an atmosphere including nitrogen (N), phosphorus (P), or hydrogen. As a method of reducing the time of annealing, millisecond annealing process using techniques such as laser annealing and flash lamp annealing may be used. An RF microwave annealing is effective means for causing recrystallization even at a low temperature.

The region where crystals of the 3C—SiC structure are formed by recrystallizing process is a region sandwiched by the metallic silicide, the n$^+$-type SiC region 15 of the 3C—SiC structure and the p$^+$-type SiC region 17 of the 3C—SiC structure as an ultimate structure. The recrystallized region may not necessarily be the entire region of the amorphous layer 40. The recrystallizing process often advances with a portion close to the interface between the substrate and the amorphous layer 40 being growth nuclear, and a portion of the amorphous layer 40 close to the surface may remain as an amorphous layer. In this case, the process temperature for forming the metallic silicide 7 in a subsequent step can be reduced, and there is an advantage in that this effectively acts on suppression of the characteristics deterioration of the gate insulating film.

Subsequently, on the side surfaces of the contact hole (opening portion) 42, for example, side walls (offset spacers) 25 of the silicon nitride film (second insulating film) are formed by sidewall process.

Figure 5:
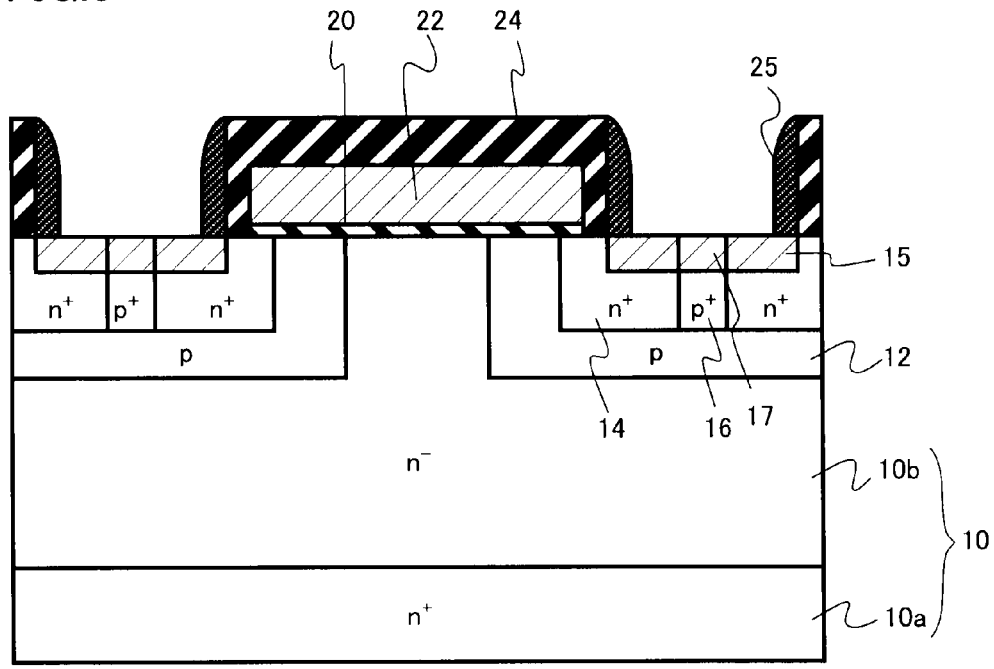
FIG. 5 is a cross sectional schematic diagram illustrating a step of the method for manufacturing the semiconductor device according to the first embodiment.

More specifically, for example, the silicon nitride film (SiN) is deposited using chemical vapor deposition (CVD) method. Thereafter, with the anisotropic etching, SiN is removed from the layer insulating film (first insulating film) 24 and the bottom surface of the contact hole (opening portion) 42, and the SiN side wall 25 is selectively formed on the sidewall of the contact hole 42 (FIG. 5).

In this case, the SiN film thickness, i.e., the thickness of the side wall 25 in the horizontal direction, defines the thickness of the n$^+$-type SiC region 15 of the 3C—SiC structure in the horizontal direction. The thickness of the n$^+$-type SiC region 15 in the horizontal direction is a value obtained by subtracting the thickness of the SiC region in the horizontal direction consumed in the formation of the metallic silicide, performed later, from the SiN film thickness. Therefore, the allowable SiN minimum film thickness is the thickness of the SiC region in the horizontal direction consumed in the formation of the metallic silicide, and if equal to or more than that, the n$^+$-type SiC region 15 of the 3C—SiC structure would remain.

However, as the thickness of the n$^+$-type SiC region 15 of the 3C—SiC structure in the horizontal direction is shorter, the parasitic resistance caused by the diffusion layer is reduced, which reduces the device characteristic ON-resistance. For this reason, the thickness may be determined in view of process variation and film thickness variation of the metallic silicide. More specifically, the SiN film thickness is desirably 10 nm to 50 nm.

Figure 6:
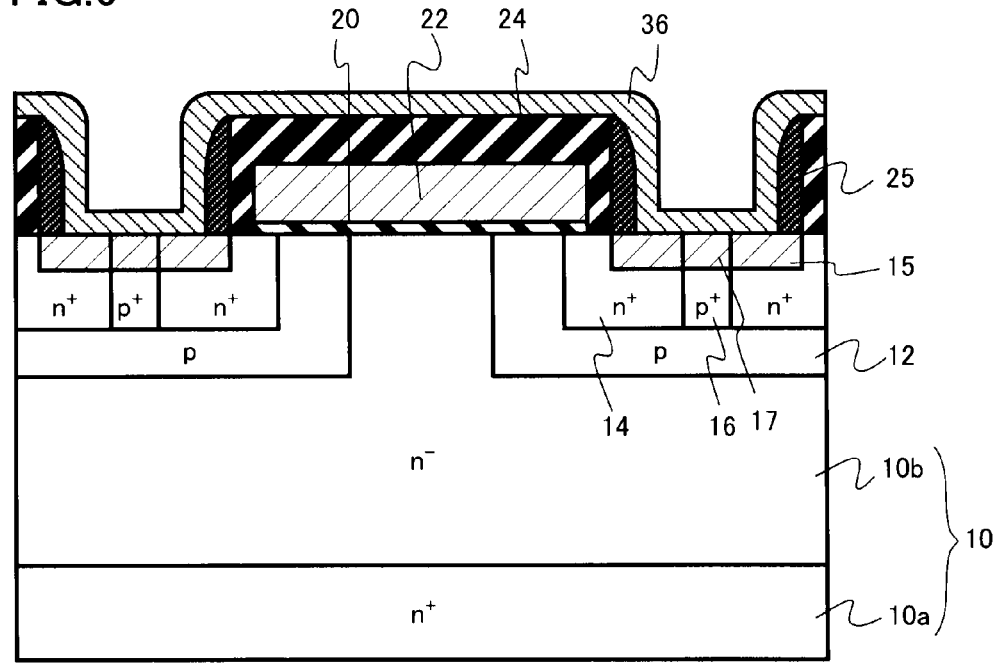
FIG. 6 is a cross sectional schematic diagram illustrating a step of the method for manufacturing the semiconductor device according to the first embodiment.

Subsequently, a metallic film 36 is formed on a portion of the n$^+$-type SiC region 15 of the 3C—SiC structure, i.e., a region other than the region covered with the SiN side walls 25 (FIG. 6). More specifically, for example, a nickel film is deposited using sputtering method and the like.

Figure 7:
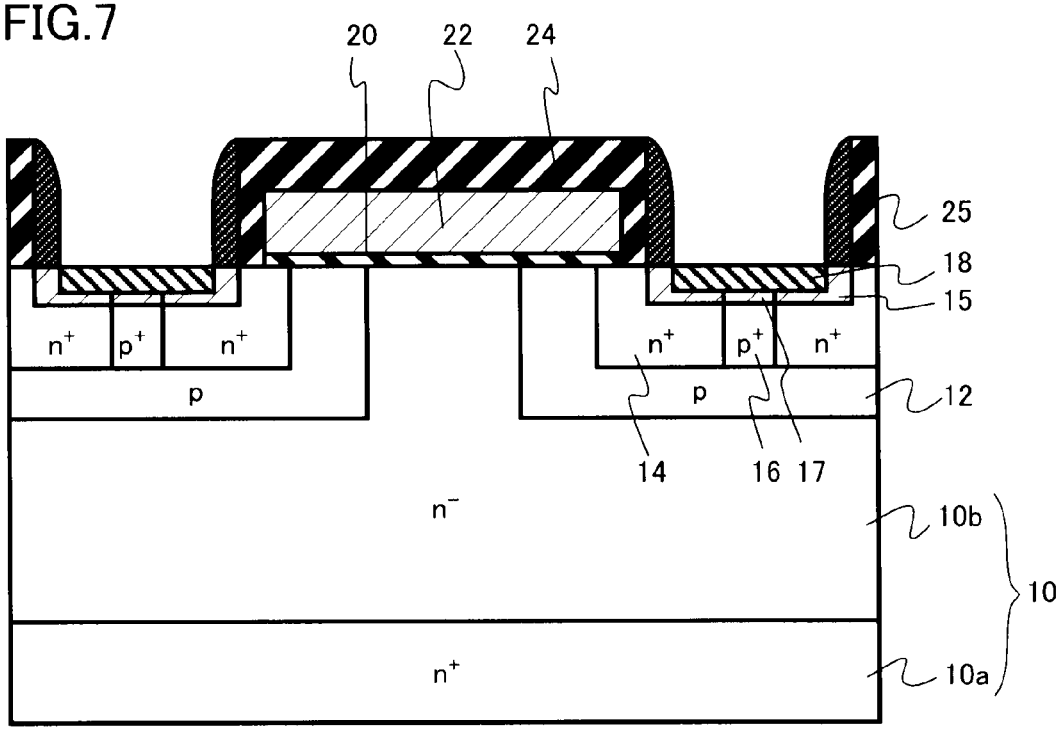
FIG. 7 is a cross sectional schematic diagram illustrating a step of the method for manufacturing the semiconductor device according to the first embodiment.

Subsequently, the nickel film 36 and silicon carbide of the n$^+$-type SiC region 15 of the 3C—SiC structure is reacted by the second thermal treatment, thereby forming the nickel silicide layer (metallic silicide layer) 18. Thereafter, the unreacted nickel film 36 is removed (FIG. 7).

More specifically, for example, annealing process is performed at 550° C. to 1000° C., so that the nickel silicide layer 18 is formed at the Ni/SiC interface, and unreacted Ni on the layer insulating film 24 and the side wall 25 is removed by acid solution treatment.

The nickel silicide layer 18 includes a bottom portion and a side surface portion, and with the side surface portion and the bottom portion, a structure is made such that the n+-type SiC region 15 of the 3C—SiC structure and the pt-type SiC region 17 of the 3C—SiC structure are sandwiched between the n+-type SiC region (first n-type impurity region) 14 of the 4H—SiC structure and the p+-type SiC region (second p-type impurity region) 16 of the 4H—SiC structure and the nickel silicide layer 18.

Depending on the nickel film thickness and annealing process conditions, excessive carbon (C) may precipitate on the surface of the nickel silicide in response to reaction of the nickel silicide. The carbon (C) may be a factor to increase the contact property between the wire and the aluminum (Al) electrode in the upper portion and a factor to increase the parasitic resistance, which degrades the device characteristics or the reliability thereof.

To solve this problem, it is effective to provide titanium (Ti) in the nickel film 36 of FIG. 6, or make a stacked layer structure in which titanium (Ti) is provided at an upper portion or a lower portion of the nickel film 36. In this case, the titanium (Ti) is prudentially reacted with the carbon (C), and this has an effect suppressing precipitation of the carbon (C) to the surface of the nickel silicide.

A two-step annealing method is also effective as a method for forming the nickel silicide layer 18. In this case, silicide is formed at a relatively low temperature of about 700 degrees or less as the first step annealing process, and then the second step annealing process is performed at a temperature higher than that of the first step annealing process after the unreacted Ni removing process with acid solution. When this is done, the contact resistance can be further reduced.

Figure 8:
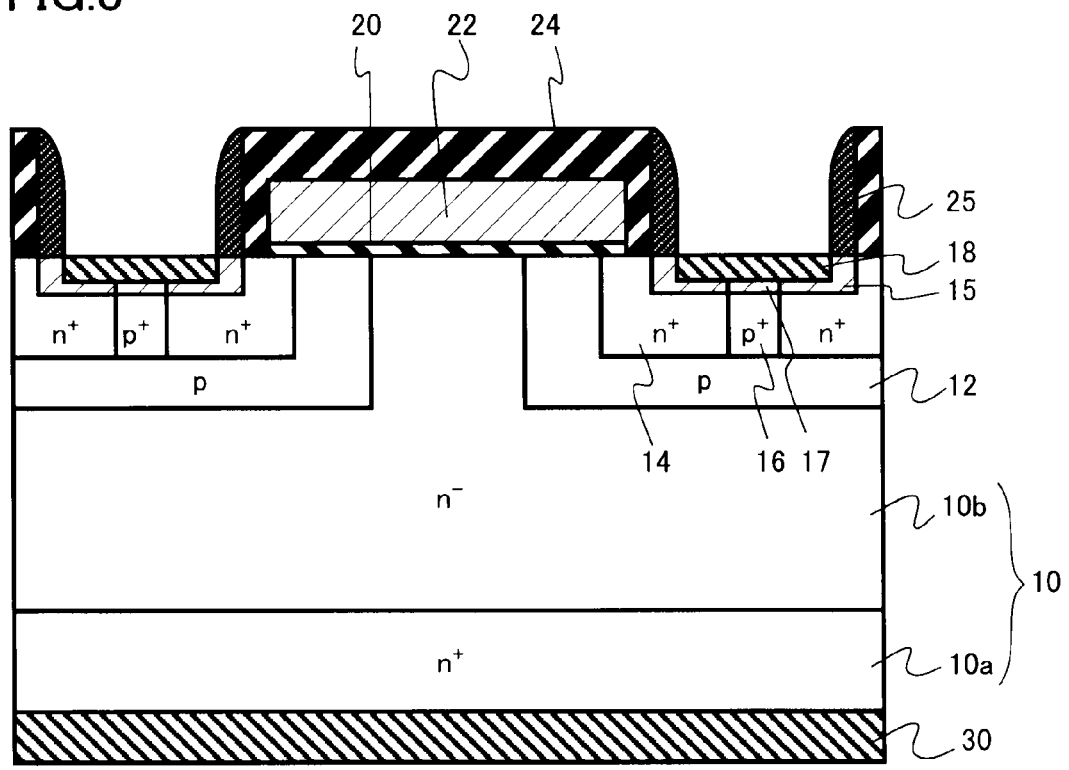
FIG. 8 is a cross sectional schematic diagram illustrating a step of a method for manufacturing the semiconductor device according to the first embodiment.

Subsequently, on the n+-type SiC layer 10a, i.e., on the back surface side of the SiC substrate 10, the nickel silicide film (second nickel silicide region) 30 is formed (FIG. 8).

Thereafter, on the first nickel silicide region 18, the first metallic electrode 28 is formed by, for example, sputtering aluminum. Then, on the second nickel silicide region 30, the second metallic electrode 32 is formed by, for example, sputtering aluminum.

According to the manufacturing method as described above, the DIMOSFET 100 as shown in FIG. 1 is formed.

According to the manufacturing method of the present embodiment, the SiC having the 3C—SiC structure is used in the source region, which achieves the low parasitic resistance, and this enables manufacturing of the semiconductor device having high performance.

(Second Embodiment)

A semiconductor device according to the present embodiment is the same as the first embodiment except that only in side surface portions of the metallic silicide layer, the second n-type impurity region is sandwiched between the metallic silicide layer and the first n-type impurity region. Accordingly, description about the same contents as those of the first embodiment is omitted.

Figure 9:
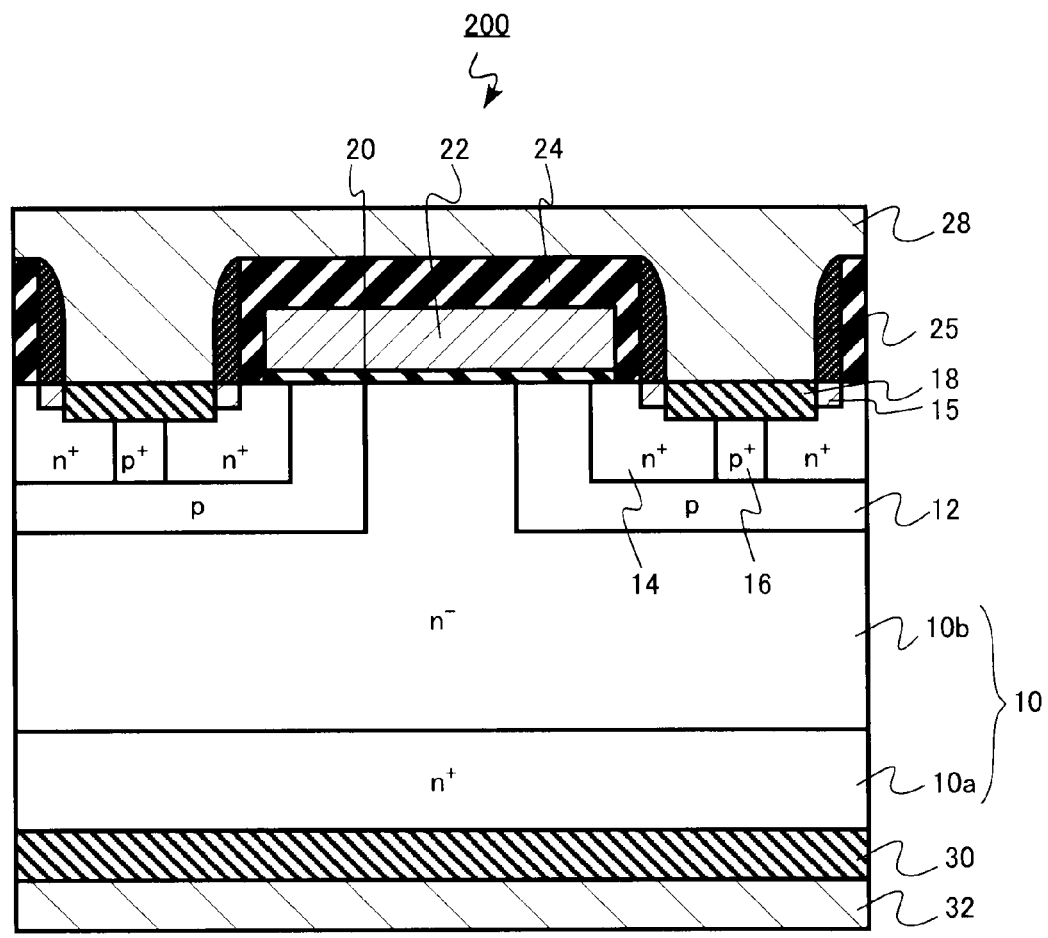
FIG. 9 is a cross sectional schematic diagram illustrating a semiconductor device according to a second embodiment.

FIG. 9 is a cross sectional schematic diagram illustrating a semiconductor device according to the present embodiment.

As shown in FIG. 9, a DIMOSFET 200 has the following structure. Only in side surface portions of the nickel silicide layer 18, the n+-type SiC region (second n-type impurity region) 15 of the 3C—SiC structure is sandwiched between the nickel silicide layer 18 and the n+-type SiC region (first n-type impurity region) 14 of the 4H—SiC structure. In other words, this structure is such that the bottom portion of the nickel silicide layer 18 and a portion of the side surface portion are in contact with the n+-type SiC region (first n-type impurity region) 14 and the p+-type SiC region (second p-type impurity region) 16 of the 4H—SiC structure. Therefore, the 3C—SiC structure region is formed only in a portion immediately under the side wall 25, which is shallower than the film thickness of the nickel silicide layer 18.

When the transistor operates in ON state, a current following from the nickel silicide layer 18 to the source diffusion layer is concentrated on a portion in proximity to the surface of the substrate, i.e., a portion shallower than the film thickness of nickel silicide layer 18 immediately under the side wall 25. For this reason, even with the structure according to the present embodiment, the ON-resistance of the transistor due to the effect of reduction of the contact resistance can be effectively reduced.

Further, the 3C—SiC hardly has any effect of band offset at the end of the valence band as compared with the 4H—SiC. Therefore, the contact resistance with the well region can be maintained at the same level as the that obtained from the structure according to the first embodiment.

As compared with the first embodiment, the semiconductor device according to the present embodiment can be formed with a lower thermal budget, and therefore, degradation of the gate stack structure and the interface characteristics can be further suppressed. The reason why the semiconductor device according to the present embodiment can be formed with a lower thermal budget is that the 3S—SiC recrystallized region can be reduced.

The semiconductor device according to the present embodiment can be achieved with the same manufacturing method as the first embodiment. More specifically, this is achieved by controlling the ion implantation energy during conversion into the amorphous state and the film thickness during the nickel deposition.

(Third Embodiment)

A semiconductor device according to the present embodiment is the same as the first embodiment except that the gate electrode has a stacked structure of polycrystal silicon and nickel silicide. Accordingly, description about the same contents as those of the first embodiment is omitted.

Figure 10:
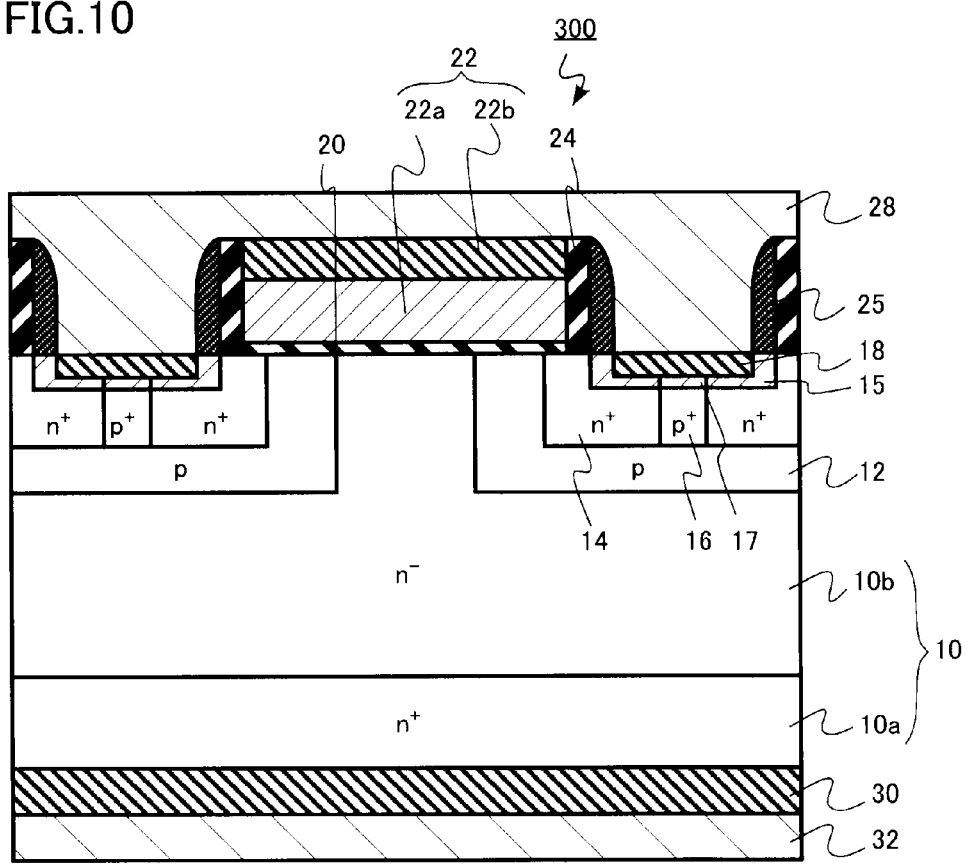
FIG. 10 is a cross sectional schematic diagram illustrating a semiconductor device according to a third embodiment.

FIG. 10 is a cross sectional schematic diagram illustrating a semiconductor device according to the present embodiment.

As shown in FIG. 10, in a DIMOSFET 300 according to the present embodiment, a gate electrode 22 has a gate stack structure of a two-layer structure including a polycrystalline silicon layer 22a and a nickel silicide layer 22b. The nickel silicide layer 22b is NiSi phase of which Ni:Si ratio is 1:1.

When this structure is employed, the specific resistance rate in the portion of the gate electrode 22 can be reduced. For example, when the gate electrode is made in this structure, the sheet resistance of the gate electrode 22 becomes one tenth or less as compared with a case where there is only one layer of polycrystalline silicon. Accordingly, high frequency operation is achieved with the DIMOSFET 300. This is because the specific resistance of the nickel silicide layer 22b is one tenth or less than that of the polycrystal silicon layer 22a. When this structure is employed, the threshold voltage of the DIMOSFET 300 increases by about 0.5 V as compared with the gate electrode of the n-type polycrystal silicon single layer. This is because the work function of the NiSi electrode is higher than that of the n+-type polycrystal silicon by about 0.5 eV. Accordingly, the normally-OFF DIMOSFET can be easily achieved. When the film thickness ratio between the nickel film and the n-type polycrystal silicon is changed so that the thickness of the nickel film increases, the composition of nickel of the gate electrode increases. Therefore, the threshold voltage can be set at a level still higher by up to about 0.3 eV. In this case, the formed silicide phase is $Ni_2Si$ and $Ni_3Si$.

Instead of the nickel silicide, the upper portion of the gate electrode 22 may use metallic silicide, other metals, and metallic compounds, which exhibit metallic characteristics. Silicides such as Ti, Co, W, and Mo stably maintain the structures thereof even at a high temperature, and therefore, they are preferable as they can withstand a process temperature of a step subsequent to the gate electrode. It is also effective to replace the entire gate electrode with a high-temperature stable material having a low resistance and having such metallic properties.

The metallic silicide layer in the upper portion of the gate electrode 22 may be formed continuously to the deposition of the polycrystalline silicon, or if it is the same metallic material as the source region, it may be formed with the same timing as the formation of the metallic silicide layer in the source region.

Hereinabove, according to the present embodiment, in addition to the effects of the first embodiment, this achieves a new effect of improving the performance caused by the decreased sheet resistance of the gate electrode.

(Fourth Embodiment)

A semiconductor device according to the present embodiment is the same as the first embodiment except that the gate electrode has a stacked layer structure including a polycrystalline silicon, carbon-containing polycrystalline silicon, and a nickel silicide. Accordingly, description about the same contents as those of the first embodiment is omitted.

Figure 11:
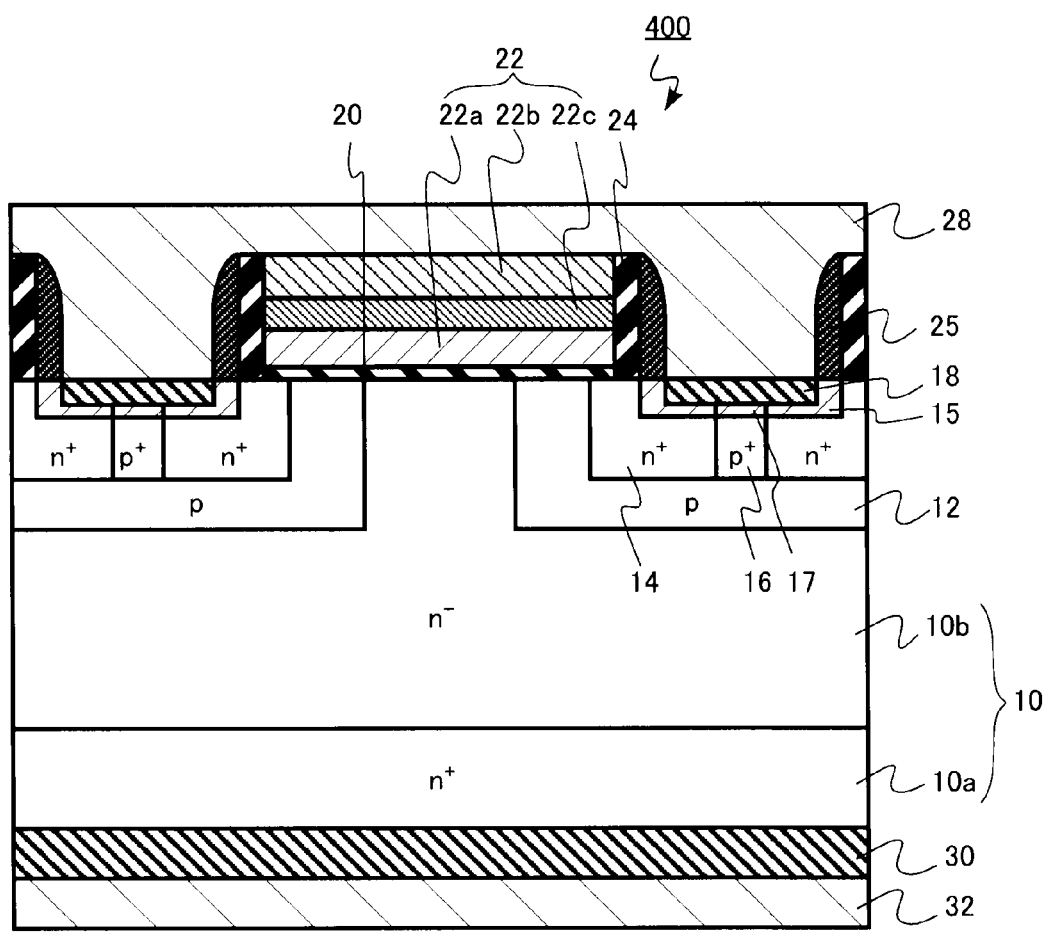
FIG. 11 is a cross sectional schematic diagram illustrating a semiconductor device according to a fourth embodiment.

FIG. 11 is a cross sectional schematic diagram illustrating a semiconductor device according to the present embodiment.

As shown in FIG. 11, in a DIMOSFET 400 according to the present embodiment, a gate electrode 22 has a gate stack structure of a three-layer structure including a polycrystalline silicon layer 22a, a carbon-containing polycrystalline silicon layer (carbon-doped polycrystalline silicon layer) 22c, and a nickel silicide layer 22b.

When this structure is employed, the specific resistance rate in the portion of the gate electrode 22 can be reduced. For example, when the gate electrode is made in this structure, the sheet resistance of the gate electrode 22 becomes one tenth or less as compared with a case where there is only one layer of polycrystalline silicon.

Since the carbon-containing polycrystalline silicon layer 22c is inserted between the polycrystalline silicon layer 22a and the nickel silicide layer 22b, thermal stability of the nickel silicide layer 22b is improved. Therefore, on the SiC in the source region portion, even after the process temperature required where the first nickel silicide layer 18 for achieving low resistance contact is formed, the layer structure can be maintained.

C composition of the carbon-containing polycrystalline silicon layer 22c is desirably between 0.1 atomic % to 3.0 atomic %. In this range, the carbon-containing polycrystalline silicon layer 22c can be formed using CVD method at a relatively low temperature, and thermal stability of the nickel silicide layer 22b formed in the upper portion is sufficiently improved.

According to the present embodiment, it is easy to simultaneously form the metallic silicide layer of the source region and the metallic silicide layer in the upper portion of the gate electrode 22.

Hereinabove, according to the present embodiment, in addition to the effects of the first embodiment, this achieves a new effect of improving the performance caused by the decreased sheet resistance of the gate electrode. The DIMOSFET is achieved that has high thermal stability and that can be manufactured easily.

(Fifth Embodiment)

The semiconductor device according to the present embodiment is the same as the first embodiment except that two side walls, i.e., a first side wall and a second side wall, are formed on side surfaces of the gate electrode. Accordingly, description about the same contents as those of the first embodiment is omitted.

The method for manufacturing the semiconductor device according to the present embodiment additionally includes a step of forming a first side wall of the first insulating film on the gate electrode after the step of forming the gate electrode, and in the step of making a portion of the first n-type impurity region into amorphous state, ion implantation is performed using the first side wall as a mask. In addition, between the step of forming the second n-type impurity region and the step of forming the metallic film, the method further includes a step of forming a second side wall of the second insulating film on the first side wall. Except the above step, the steps are basically the same as those of the first embodiment.

Figure 12:
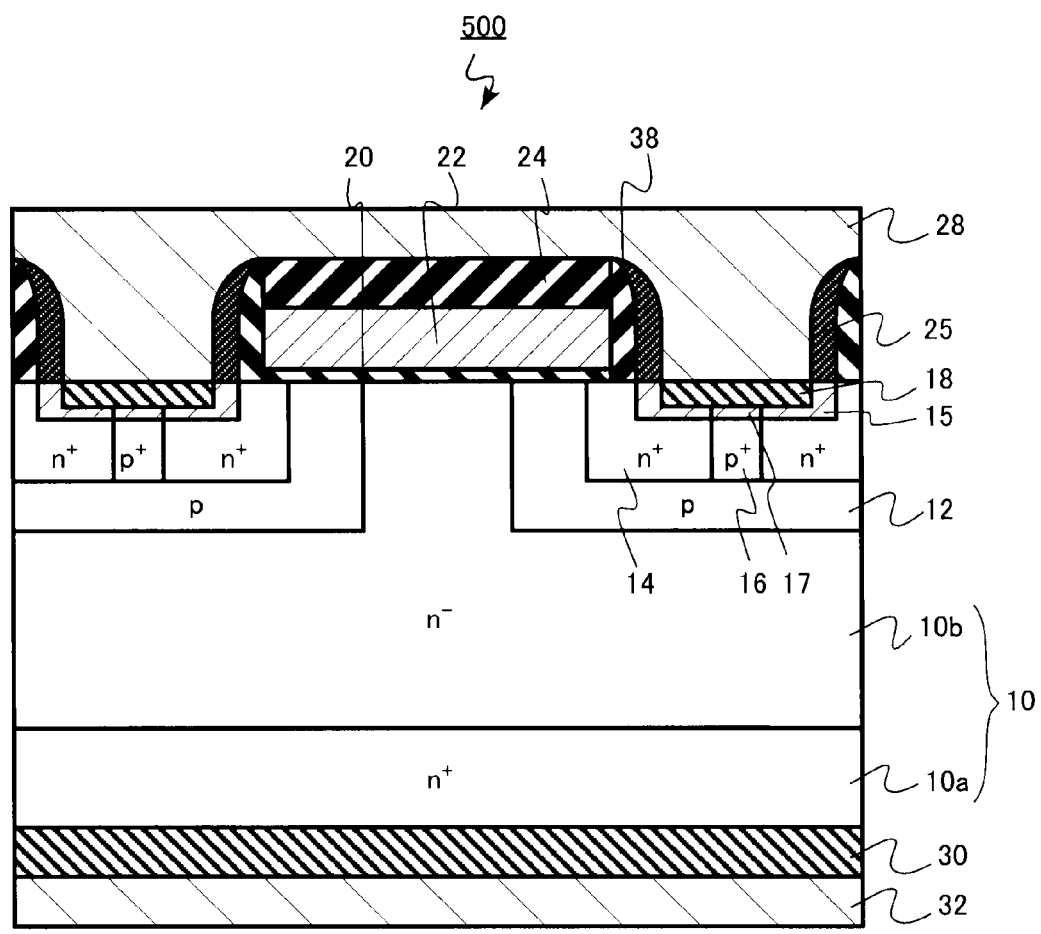
FIG. 12 is a cross sectional schematic diagram illustrating a semiconductor device according to a fifth embodiment.

FIG. 12 is a cross sectional schematic diagram illustrating a semiconductor device according to the present embodiment.

As shown in FIG. 12, in a DIMOSFET 500 according to the present embodiment, for example, two side walls, i.e., a first side wall 38 made of a silicon oxide film and a second side wall 25 made of a silicon nitride film, are formed on the side surfaces of the gate electrode 22.

Figure 13:
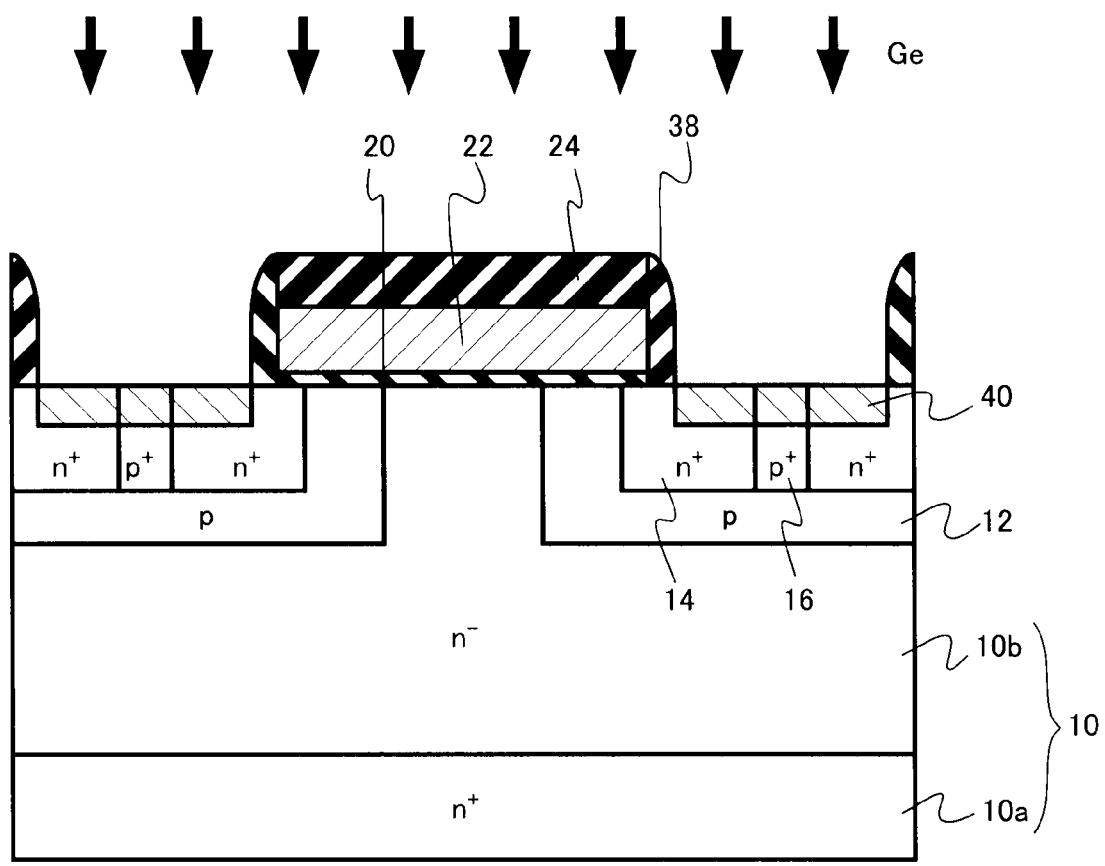
FIG. 13 is a cross sectional schematic diagram illustrating a step of a method for manufacturing the semiconductor device according to the fifth embodiment.
Figure 14:
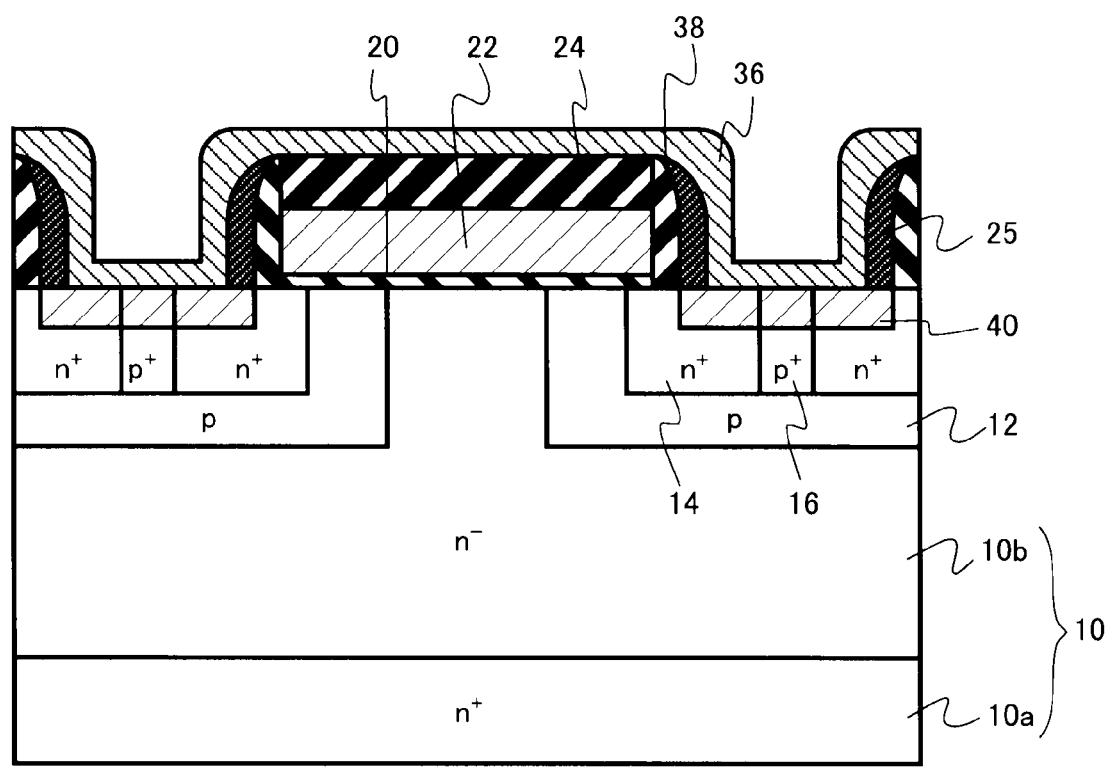
FIG. 14 is a cross sectional schematic diagram illustrating a step of the method for manufacturing the semiconductor device according to the fifth embodiment.

FIGS. 13 and 14 are cross sectional schematic diagrams illustrating steps of the method for manufacturing the semiconductor device according to the present embodiment.

After the gate electrode 22 is formed, for example, the first side wall 38 of the silicon oxide film (first insulating film) is formed by sidewall process on the side surfaces of the gate electrode 22. Subsequently, an amorphous layer 40 is formed with ion implantation of Ge and the like using the first side wall 38 as a mask (FIG. 12).

Thereafter, like the first embodiment, for example, the second side wall 25 made of the silicon nitride film is formed on the first side wall 38, i.e., the side surface of the first side wall 38. Thereafter, after the nickel film 36 is formed (FIG. 14), a DIMOSFET 500 of FIG. 11 is formed by performing the same process as that of the first embodiment.

According to the present embodiment, the nickel silicide layer 18 and the n$^+$-type SiC region 15 of the 3C—SiC structure are formed with offset with respect to the gate electrode 22 in a self aligning manner. Therefore, this enables controlling the structure of the source diffusion layer region with high accuracy while suppressing variation due to alignment of lithography.

As a result, this can accurately reduce the lengths of the source diffusion layer regions in the horizontal direction such as the n$^+$-type SiC region 15 of the 3C—SiC structure and the n$^+$-type SiC region 14 of the 4H—SiC structure, and make the low resistance silicide region larger than the source diffusion layer region. Therefore, according to the present embodiment, the parasitic resistance component connected to the channel in series is reduced, so that characteristic ON-resistance is further improved.

(Sixth Embodiment)

A semiconductor device according to the present embodiment is different from the first embodiment in that it is not a DIMOSFET but is an insulated gate bipolar transistor (IGBT). Essential portions of the structure and the manufacturing method of the source region are the same as those of the first embodiment. Accordingly, description about the same contents as those of the first embodiment is omitted.

A semiconductor device according to the present embodiment includes a semiconductor substrate having a p-type silicon carbide layer and an n-type silicon carbide layer on the p-type silicon carbide layer, a first p-type impurity region formed in the n-type silicon carbide layer, a first n-type impurity region of 4H—SiC structure formed in the n-type silicon carbide layer, a second n-type impurity region of 3C—SiC structure formed in the n-type silicon carbide layer and having a depth shallower than that of the first n-type impurity region, a gate insulating film extending over surfaces of the n-type silicon carbide layer, the first p-type impurity region, and the first n-type impurity region, a gate electrode formed on the gate insulating film, and a metallic silicide layer formed on the first n-type impurity region and having a bottom portion and a side surface portion such that the second n-type impurity region is sandwiched between the first n-type impurity region and at least the side surface portion.

Figure 15:
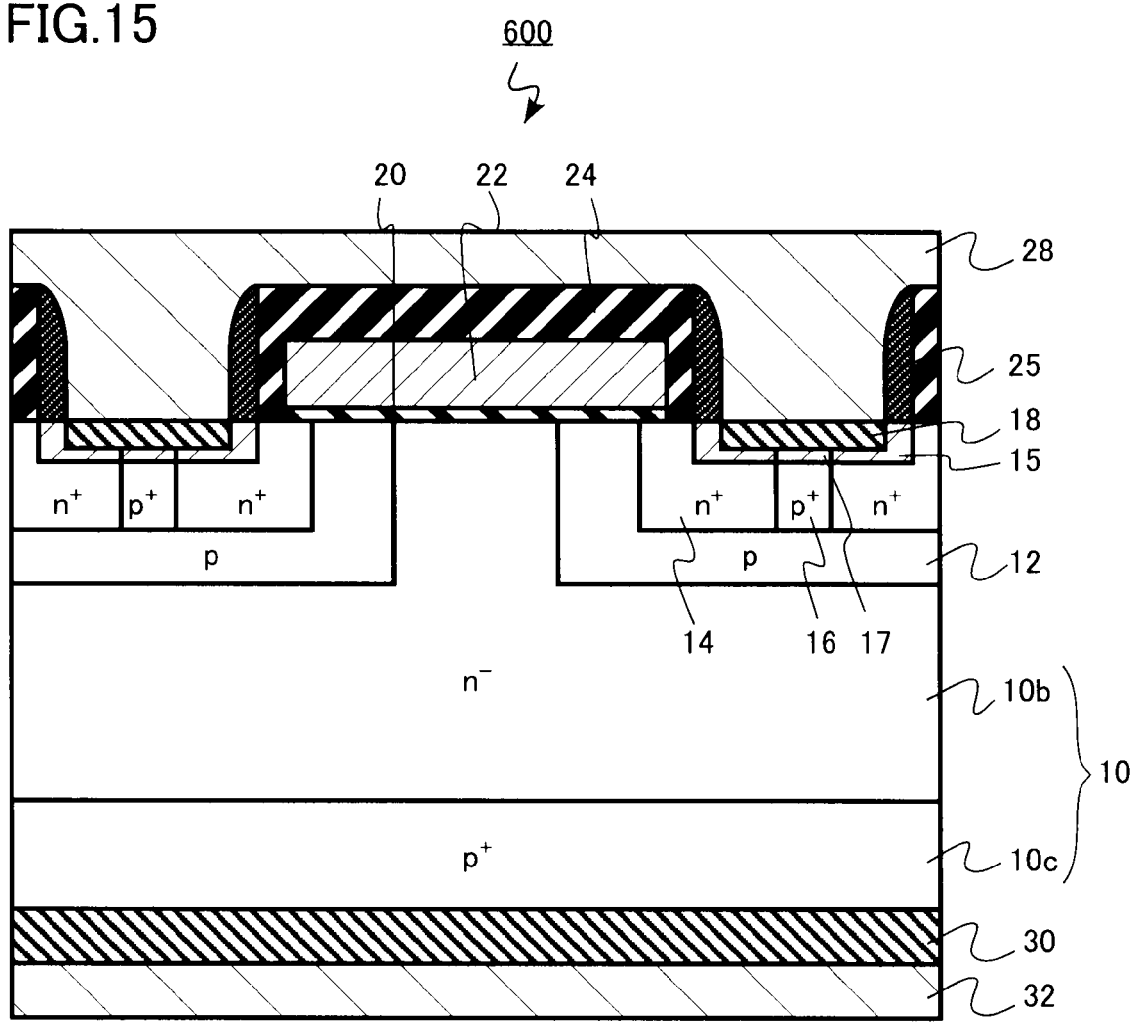
FIG. 15 is a cross sectional schematic diagram illustrating a semiconductor device according to a sixth embodiment.

FIG. 15 is a cross sectional schematic diagram illustrating a semiconductor device according to the present embodiment. The semiconductor device according to the present embodiment is an IGBT.

As shown in FIG. 15, an IGBT 600 uses a SiC substrate 10 of 4H—SiC including a p$^+$-type SiC layer (p-type silicon carbide layer) 10c and an n$^-$-type SiC layer (n-type silicon carbide layer) 10b.

The p$^+$-type SiC layer 10c includes, for example, Al of which impurity concentration is, for example, about $5 \times 10^{18}$ to $1 \times 10^{19}$ cm$^{-3}$ as a p-type impurity. The p$^+$-type SiC layer 10c functions as a collector region for the IGBT 600.

On the p$^+$-type SiC layer 10c, i.e., the back surface side of the SiC substrate 10, a second nickel silicide layer 30 and a second metallic electrode 32 are formed as collector electrode.

The first nickel silicide layer 18 and the first metallic electrode 28 function as an emitter electrode and a well electrode of the IGBT 600.

The other configurations are the same as those of the first embodiment.

Hereinabove, according to the present embodiment, the SiC having the 3C—SiC structure is used in the source region, which achieves the low parasitic resistance, and this enables high performance IGBT and the manufacturing method thereof.

While certain embodiments have been described, these embodiments have been presented by way of example only, and are not intended to limit the scope of the inventions. Indeed, the semiconductor device and the method for manufacturing the same described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
   a semiconductor substrate having a first n-type silicon carbide layer and a second n-type silicon carbide layer of which n-type impurity concentration is less than that of the first n-type silicon carbide layer;
   a first p-type impurity region formed in the second n-type silicon carbide layer;
   a first n-type impurity region of 4H-SiC structure formed in the second n-type silicon carbide layer;
   a second n-type impurity region of 3C-SiC structure formed in the second n-type silicon carbide layer and having a depth shallower than that of the first n-type impurity region;
   a gate insulating film extending over surfaces of the second n-type silicon carbide layer, the first p-type impurity region, and the first n-type impurity region;
   a gate electrode formed on the gate insulating film;
   a metallic silicide layer formed above the first n-type impurity region and having a bottom portion and a side surface portion, the second n-type impurity region is sandwiched between the first n-type impurity region and at least the side surface portion; and
   a second p-type impurity region, the second p-type impurity region connected to the first p-type impurity region and having a depth shallower than that of the first p-type impurity region and having a p-type impurity concentration higher than that of the first p-type impurity region,
   wherein the metallic silicide layer is formed on the second p-type impurity region.

2. The device according to claim 1, wherein the second n-type impurity region is also sandwiched between the first n-type impurity region and the bottom portion of the metallic silicide layer.

3. The device according to claim 1, wherein the metallic silicide layer is a nickel silicide layer.

* * * * *